United States Patent [19]

Tseng

[11] Patent Number: 5,695,048
[45] Date of Patent: Dec. 9, 1997

[54] DOUBLE-GRID MECHANICAL ENCODER

[76] Inventor: Hsin-Te Tseng, 4F, No. 19, Shih-Chien St., Pei-Tou, Taipei, Taiwan

[21] Appl. No.: 639,732

[22] Filed: Apr. 29, 1996

[51] Int. Cl.$^6$ ............................................. H01H 19/20
[52] U.S. Cl. ................... 200/571; 200/570; 200/11 DA; 200/11.6
[58] Field of Search ........................ 204/571, 570, 204/568, 569, 272, 11 D, 11 DA, 116, 14

[56] References Cited

U.S. PATENT DOCUMENTS

| | | | |
|---|---|---|---|
| 3,501,598 | 3/1970 | Lis | 200/11 D |
| 3,609,257 | 9/1971 | Jinsenji | 200/11 D |
| 4,133,990 | 1/1979 | Wanner et al. | 200/569 |
| 4,275,279 | 6/1981 | Wagatsuma | 200/11 DA |

*Primary Examiner*—David J. Walczak
*Attorney, Agent, or Firm*—Morton J. Rosenberg; David I. Klein

[57] ABSTRACT

A double-grid mechanical encoder is provided which includes a wheel mounted around a shaft, a metal spring unit adapted to provide power supply to the wheel and to produce different voltages to an external circuit, enabling it to detect the revolving direction and amount of movement of the wheel. The wheel has two metal cores disposed on opposite sides and electrically connected together. Two annular grids are respectively disposed on opposite sides around the metal core and offset from each other by a predetermined angle. Each of the annular grids has a plurality of electrical conducting portions coupled to the metal core and a plurality of insulative portions radially and alternatively arranged around the corresponding metal core. The metal spring unit includes a first metal spring leaf and a second metal spring leaf of equal size respectively disposed in contact with the two annular grids of the wheel and caused to produce different voltage signals upon the rotary motion of the wheel. A third metal spring leaf is disposed in continuous contact with one metal core of the wheel to provide power thereto.

1 Claim, 8 Drawing Sheets

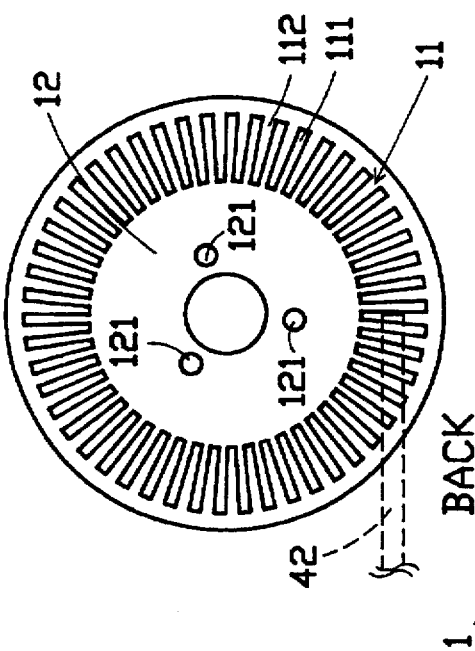
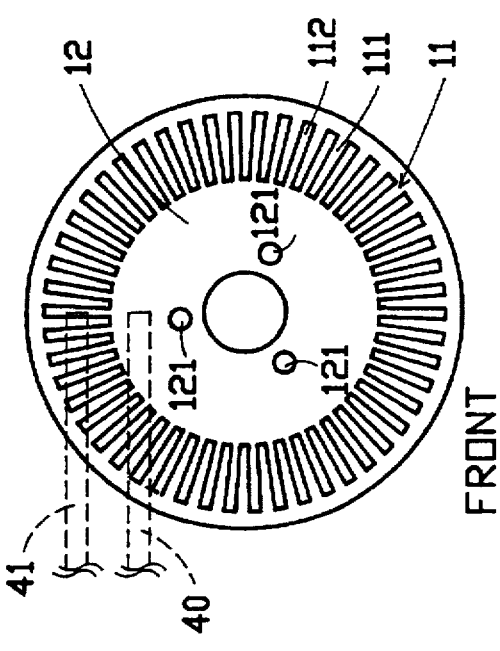
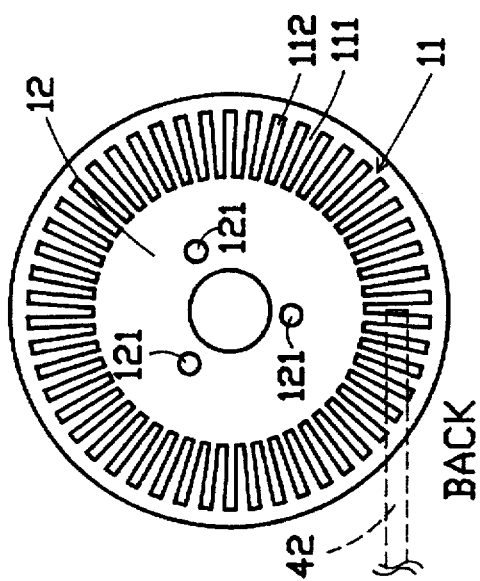
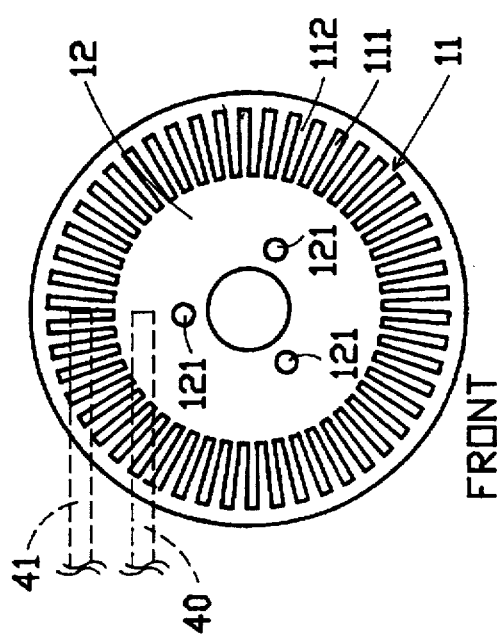

DOUBLE-GRID MECHANICAL ENCODER

BACKGROUND OF THE INVENTION

The present invention relates to a double-grid mechanical encoder which comprises two annular grids respectively disposed at two opposite sides of the wheel thereof and biased from each other at an angle for producing different voltage signals when the wheel is rotated.

A regular mechanical encoder, as shown in FIG. 1, is generally comprised of a wheel 01, and a plurality of metal spring leaves, namely, the first metal spring leaf 02, the second metal spring leaf 03, and the third metal spring leaf 04. As shown in FIG. 2, the wheel 01 comprises a metal core 014 disposed in contact with the third metal spring leaf 04, a first annular grid 013 spaced around the metal core 014 and disposed in contact with the second metal spring leaf 03, and a second annular grid 012 spaced around the first annular grid 013 and disposed in contact with the first metal spring leaf 02. The third metal spring leaf 04 provides power supply to the wheel 01. When the wheel 01 is rotated, the first metal spring leaf 02 and the second metal spring leaf 03 are driven to produce different voltage signals of which the waveforms are shown in FIG. 3. This structure of mechanical encoder is still not satisfactory in function. Because the first annular grid 013 and the second annular grid 012 must be disposed at different elevations so as to obtain encoded signals, much installation space is needed, and the number of the combination of output signals is limited. Because the first metal spring leaf 02 and the second metal spring leaf 03 are spaced from the wheel center at different distances, they move at different speeds relative to the wheel 01 and produce different bounces of different waveforms 2B, 3B. Therefore, the debouncers at the output end of the encoder must be separately adjusted. If to change the ratio of the annular grids in order to compress the ratio of the bounce waveforms relative to normal waveforms 2A, 3A, the resolution will be affected.

SUMMARY OF THE INVENTION

The present invention has been accomplished to provide a double-grid mechanical encoder which eliminates the aforesaid drawbacks. It is one object of the present invention to provide a double-grid mechanical encoder which improves the resolution of the detection of the revolving direction and amount of movement of the wheel. It is another object of the present invention to provide a double-grid mechanical encoder which allows the debouncer at the output end thereof to be conveniently adjusted.

According to the preferred embodiment of the present invention, the double-grid mechanical encoder comprises a wheel mounted around a shaft, a metal spring unit adapted to provide power supply to the wheel and to produce different voltages to a posterior circuit, enabling it to detect the revolving direction and amount of movement of the wheel, wherein the wheel has two metal cores disposed at two opposite sides and electrically connected to each other, and two annular grids respectively disposed at two opposite sides around the metal core and offset from each other at an angle, each of the annular grids having a plurality of electrical conducting portions and a plurality of insulative portions radially and alternatively arranged around the corresponding metal core, the electrical conducting portions having different electrical conductivity and being connected to the metal cores; the metal spring unit includes a first metal spring leaf and a second metal spring leaf of equal size respectively disposed in contact with the two annular grids of the wheel and caused to produce different voltage signals upon the rotary motion of the wheel, and a third metal spring leaf disposed in contact with one metal core of the wheel to provide power supply to it.

BRIEF DESCRIPTION OF THE DRAWINGS

FIG. 8A–D shows the wheel of the double-grid mechanical encoder of the present invention moved (II)

DETAILED DESCRIPTION OF THE PREFERRED EMBODIMENT

Figure 1:
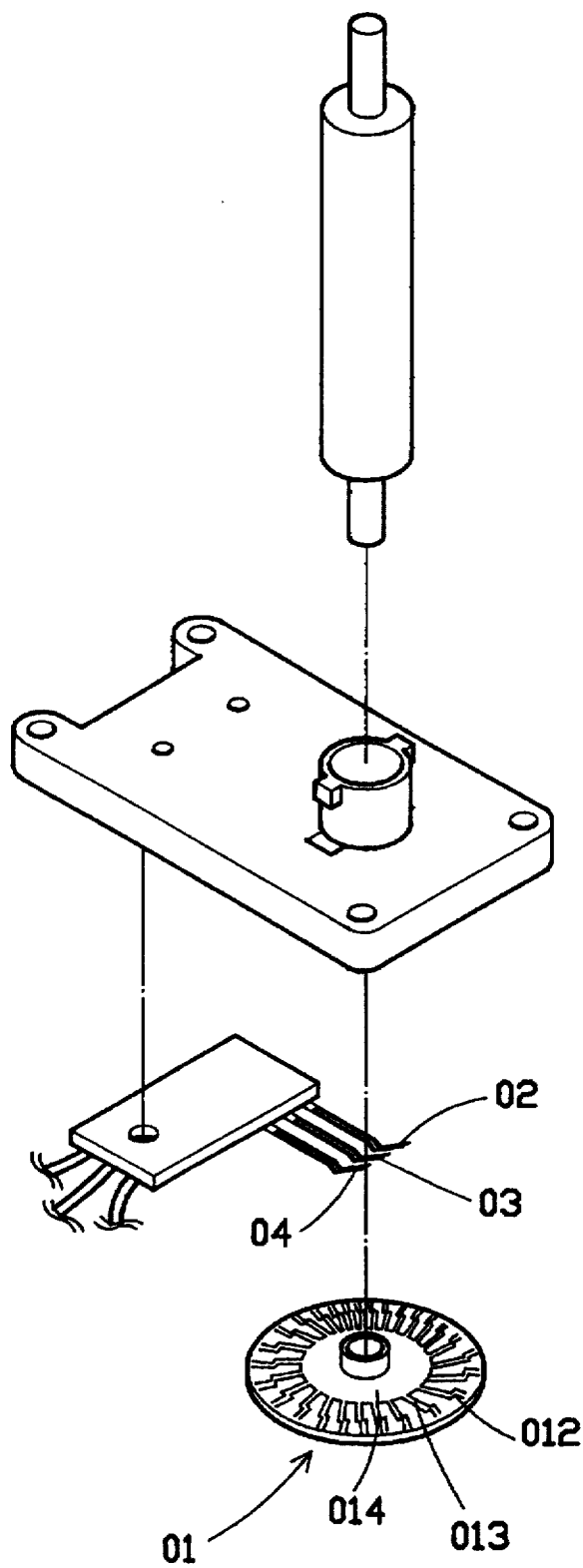
FIG. 1 is an exploded view of a mechanical encoder according to the prior art.
Figure 2:
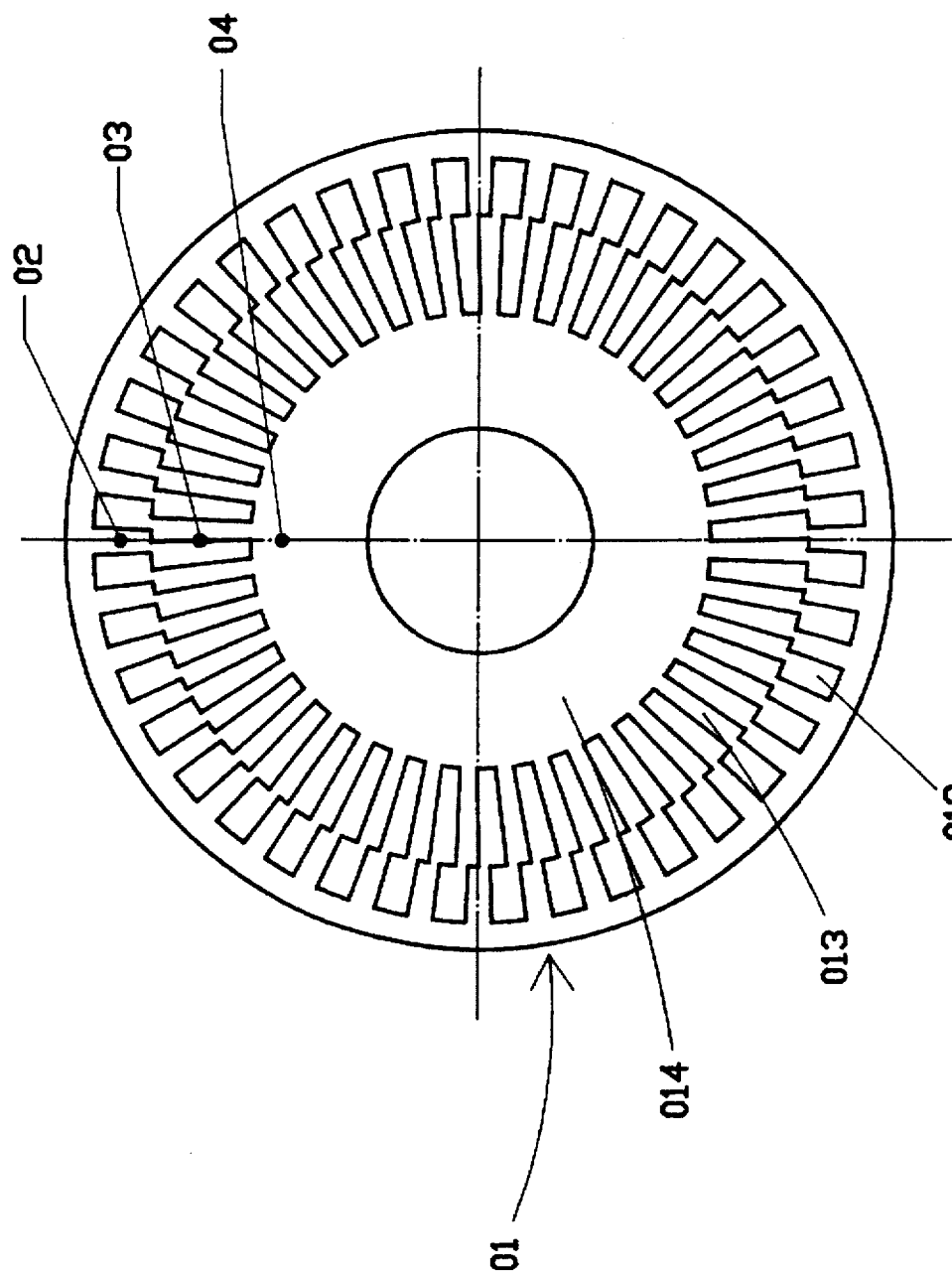
FIG. 2 is a front view in an enlarged scale of the mechanical encoder shown in FIG. 1, showing the metal spring leaves disposed in contact with the wheel.
Figure 3:
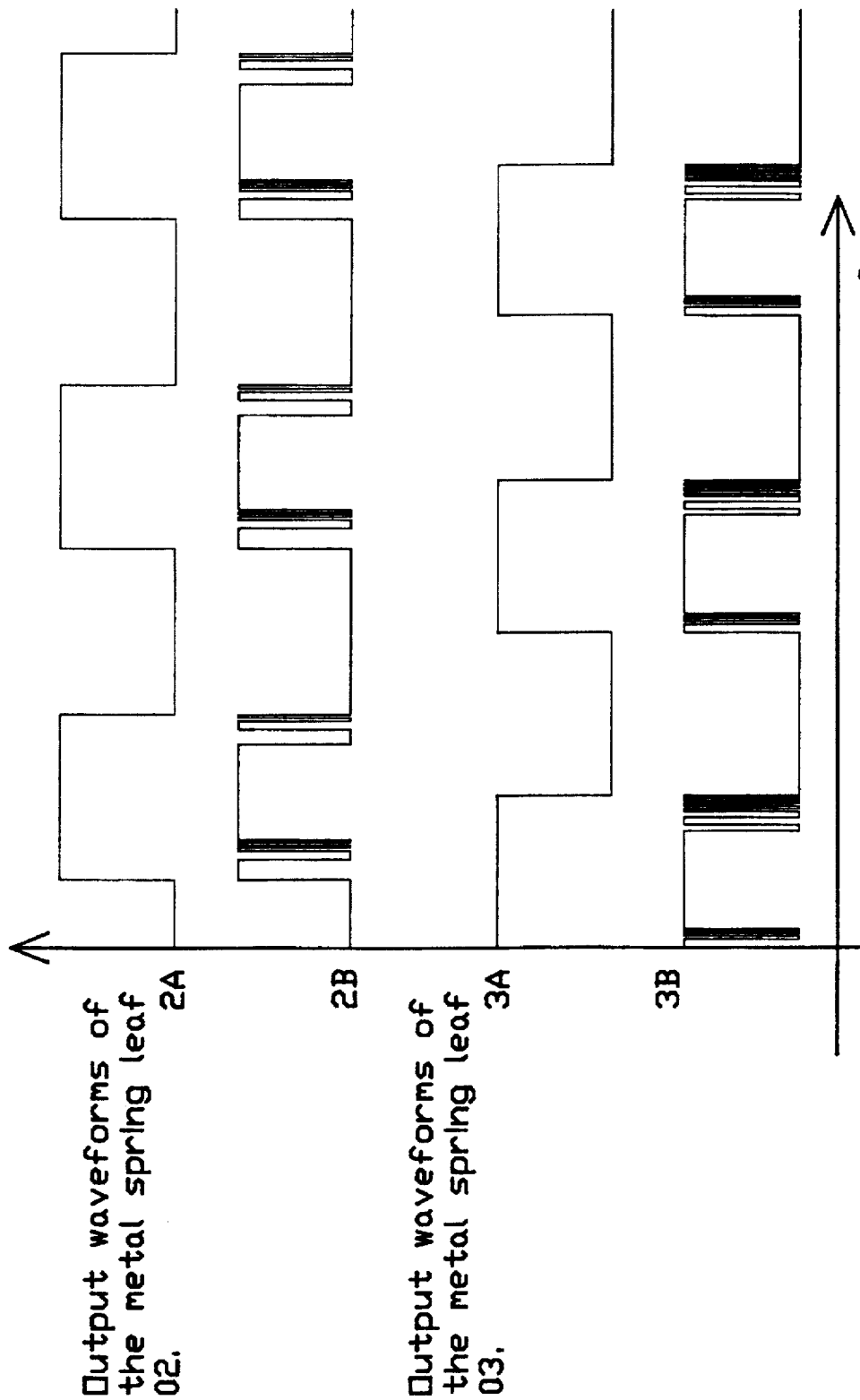
FIG. 3 shows the output waveforms of the first and second metal spring leaves of the mechanical encoder shown in FIG. 1.
Figure 4:
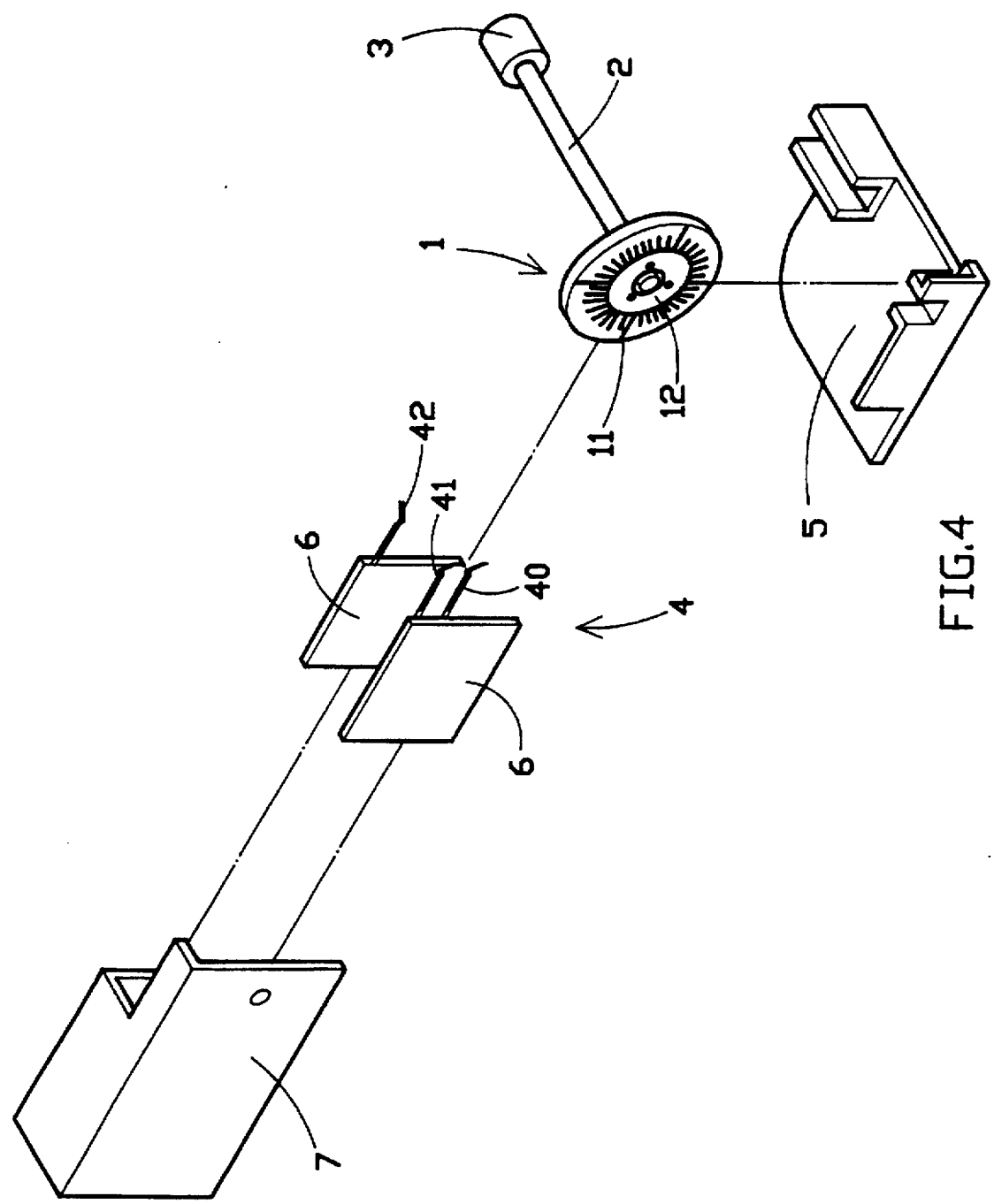
FIG. 4 is an exploded view of a double-grid mechanical encoder according to the present invention.
Figure 6:
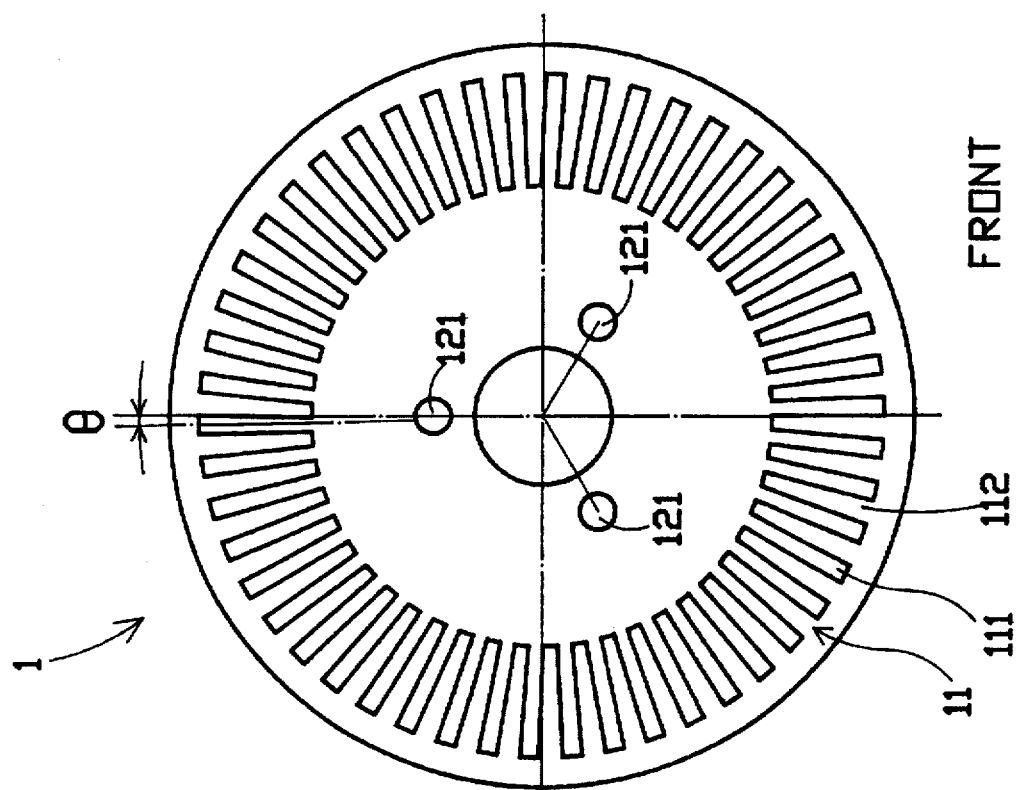
FIG. 6 is a back side view in an enlarged scale of the wheel of the double-grid mechanical encoder shown in FIG. 4.
Figure 5:
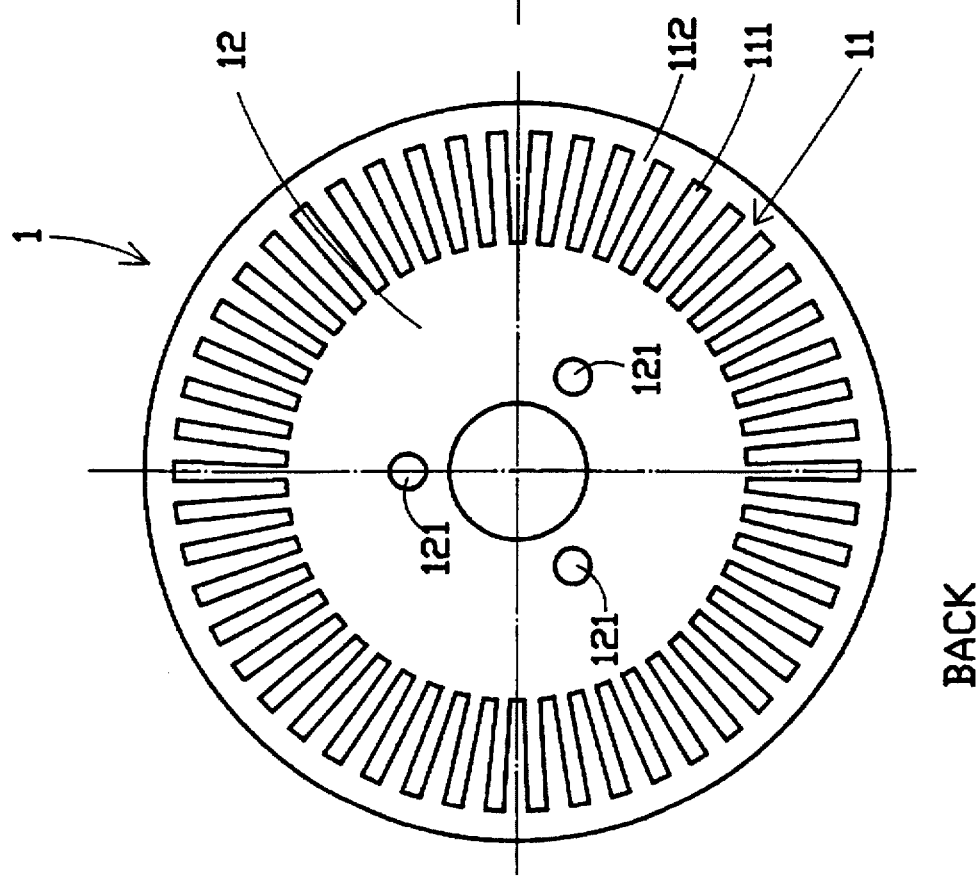
FIG. 5 is a front side view in an enlarged scale of the wheel of the double-grid mechanical encoder shown in FIG. 4.

Referring to FIGS. 4, 5, and 6, a double-grid mechanical encoder is generally comprised of a wheel 1, and a metal spring leaf unit 4. The wheel 1 has at each side a metal core 12 and an annular grid 11 around the metal core 12. The annular grid 11 at each side of the wheel 1 comprises a plurality of electrical conducting portions 111 and a plurality of insulative portions 112 radially and alternatively arranged around the corresponding metal core 12. The two annular grids 11 at the two opposite sides of the wheel 1 are offset from each other at an angle ⊖. The electrical conducting portions 111 have different electrical conductivity than the insulative portions 112. The metal core 12 is connected to the electrical conducting portions 111 of the corresponding annular grid 11. Three through holes 121 are made through the wheel 1 and mounted with electrical conductors to electrically connect the two opposite cores 12. The wheel 1 is mounted around one end of a shaft 2 and supported on a base plate 5. The opposite end of the shaft 2 is coupled to a roller 3. Two locating plates 6 are fixedly mounted on a supporting frame 7, and spaced from each other by a gap in which the wheel 1 is received and rotated. The metal spring leaf unit 4 is installed in the locating plates 6, comprising a first metal spring leaf 41 and a second metal spring leaf 42 of equal size respectively disposed in contact with the two annular grids 11 of the wheel 1, and a third metal spring leaf 40 disposed in contact with one metal core 12.

Figure 7A:
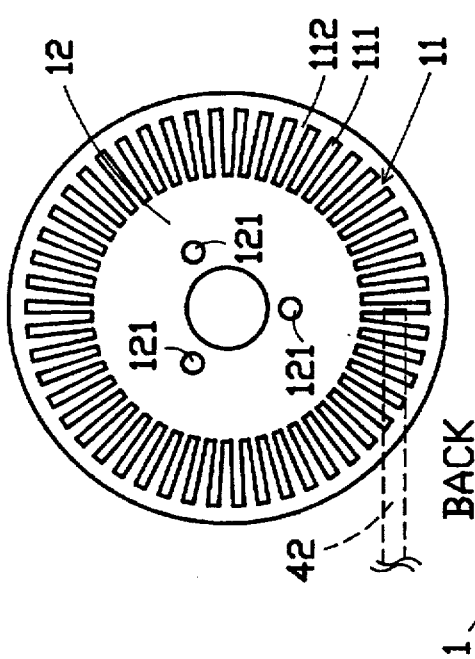
FIG. 7A–D shows the wheel of the double-grid mechanical encoder of the present invention moved (I)

Referring to FIGS. 7A–D and 8A–D, when the wheel 1 is rotated and obtains power supply from the third metal spring leaf 40, the first metal spring leaf 41 and the second metal spring leaf 42 are forced to alternatively contact the respective electrical conducting portions 11 and insulative portions 112, therefore the first metal spring leaf 41 and the second metal spring leaf 42 are driven to trigger the encoder, causing the encoder to provide digital signals as follows:

(1) the encoder provides an output signal (1,1) as shown in FIG. 7A, when the first metal spring leaf 41 and the second metal spring leaf 42 are simultaneously disposed in contact with the respective electrical conducting portions 111.

Figure 7B:
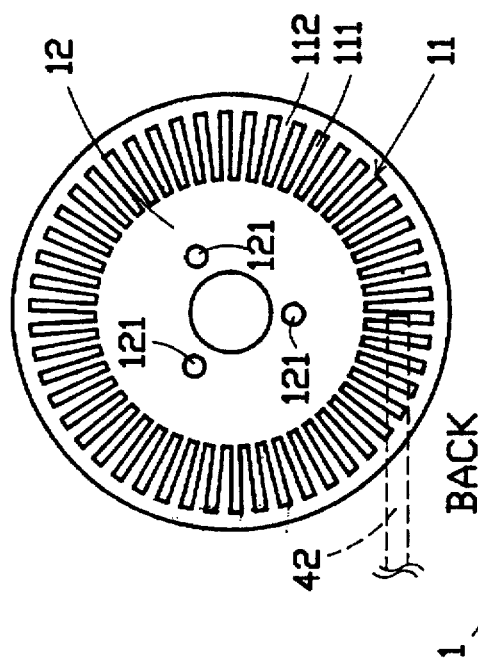
Figure 7C:
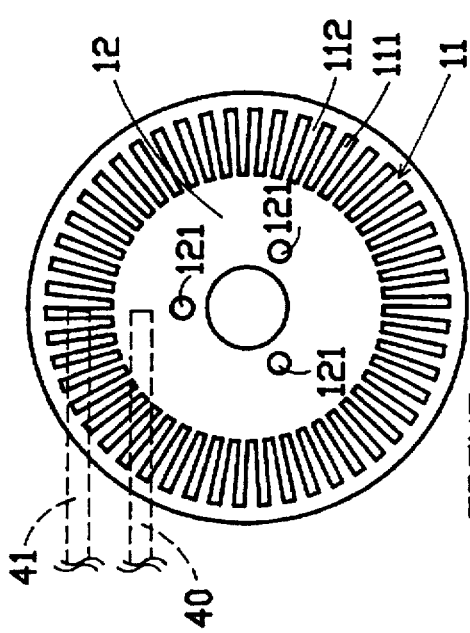
Figure 7D:
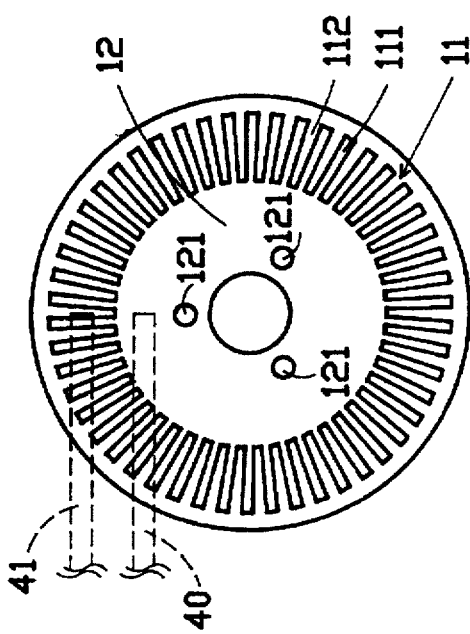

(2) the encoder provides an output signal (0,1) as shown in FIG. 7B when the first metal spring leaf 41 is disposed in contact with the corresponding insulative portions 112 and the second metal spring leaf 42 is disposed in contact with the corresponding electrical conducting portions 111.

(3) the encoder provides an output signal (0,0) as shown in FIG. 8B when the first metal spring leaf 41 and the second metal spring leaf 42 are disposed in contact with the respective insulative portions 112.

(4) the encoder provides an output signal (1,0) as shown in FIG. 8A when the first metal spring leaf 41 is disposed in contact with the corresponding electrical conducting portions 111 and the second metal spring leaf 42 is disposed in contact with the corresponding insulative portions 112.

Therefore, when the wheel 1 is rotated clockwise, signals are repeatedly provided in the order of FIGS. 7A, 7B, 8B and 8A; on the contrary, when the wheel 1 is rotated counterclockwise, signals are repeatedly provided in the order of FIGS. 8A, 8B, 7B and 7A. The posterior circuit can then determine the revolving direction of the wheel 1 subject to the order of the output signals, and the amount of movement subject to the number of outputted signals. Because the signals are produced through the first metal spring leaf 41 and the second metal spring leaf 42 which are of equal side and bilaterally disposed in contact with the two opposite sides of the wheel 1, the debouncer at the output end of the encoder can be conveniently adjusted during the production of the encoder.

Figure 9:
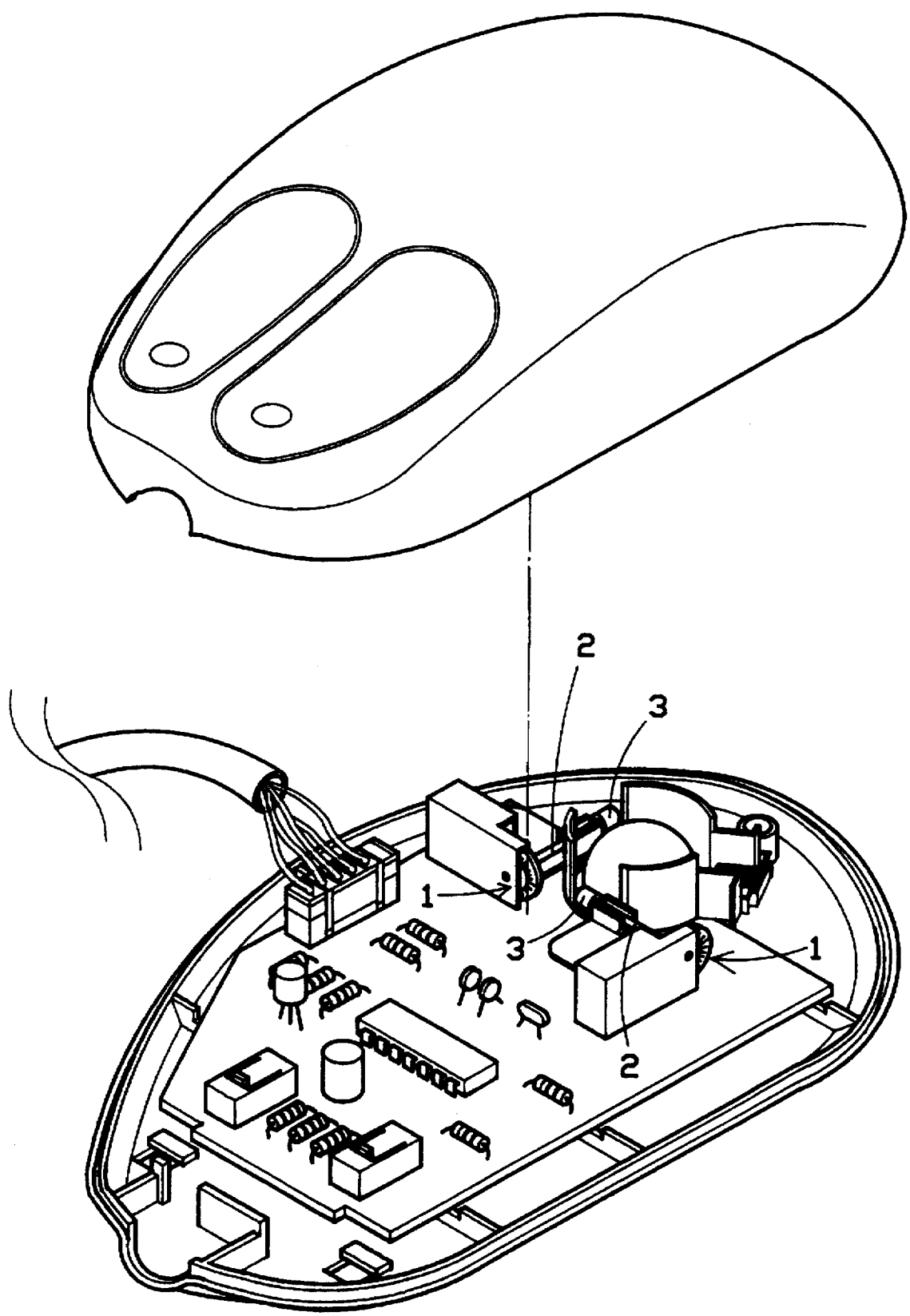
FIG. 9 is an applied view of the present invention, showing the double-grid mechanical encoder used in a mouse.

Referring to FIG. 9, the present invention can be used in a mouse so that the computer can precisely detects the moving direction of the mouse and the amount of its movement. The present invention can also be used in a monitor for vertical, horizontal synchronizing control, or in an audio equipment for volume control.

It is to be understood that the drawings are designed for purposes of illustration only, and are not intended as a definition of the limits and scope of the invention disclosed.

What the invention claimed is:

1. A double-grid mechanical encoder, comprising:

a wheel rotatably mounted on a shaft, said wheel having
(a) a pair of metal cores respectively disposed centrally on opposing sides thereof concentrically disposed about said shaft and electrically coupled together, and
(b) a pair of annular grids respectively disposed on opposing sides of said wheel surrounding said metal cores, each of said pair of annular grids being formed by a plurality of uniformly angularly spaced conductors coupled to a respective metal core and extending radially therefrom with a plurality of insulative portions respectively disposed between said plurality of conductors, said plurality of conductors of one of said pair of annular grids being offset by a predetermined angle with respect to said plurality of conductors of the other of said pair of annular grids; and, a metal spring unit for contacting said opposing sides of said wheel, said metal spring unit including a pair of first leaf spring members of equal size disposed in aligned relationship for respective contact with said pair of annular grids for coupling output signals therefrom, said metal spring unit including a second leaf spring member disposed in continuous contact with one of said pair of metal cores for supplying a voltage thereto, whereby rotation of said wheel generates output signal pulses at said pair of first leaf spring members having a sequence produced by said offset between said pair of annular grids to be indicative of displacement of said wheel and a direction of rotation thereof.

\* \* \* \* \*